US 6,701,163 B1

(12) United States Patent
Hiramatsu

(10) Patent No.: US 6,701,163 B1
(45) Date of Patent: Mar. 2, 2004

(54) BASE STATION APPARATUS AND METHOD FOR SUPPRESSING PEAK ELECTRIC POWER

(75) Inventor: Katsuhiko Hiramatsu, Yokosuka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/720,157
(22) PCT Filed: Apr. 18, 2000
(86) PCT No.: PCT/JP00/02498
§ 371 (c)(1),
(2), (4) Date: Dec. 21, 2000
(87) PCT Pub. No.: WO00/65758
PCT Pub. Date: Nov. 2, 2000

(30) Foreign Application Priority Data

Apr. 23, 1999 (JP) .......................................... P11-116054

(51) Int. Cl.⁷ ................................................ H04B 1/38
(52) U.S. Cl. ................... 455/561; 455/114.2; 455/63.1; 370/206; 375/146
(58) Field of Search ............................. 455/561, 114.2, 455/63.1; 370/206; 375/146

(56) References Cited

U.S. PATENT DOCUMENTS 5,751,705 A * 5/1998 Sato ........................... 370/335
6,009,090 A 12/1999 Oishi et al.
6,144,694 A * 11/2000 Uta et al. .................... 375/146
6,266,320 B1 * 7/2001 Hedberg et al. ............. 370/206
6,515,961 B1 * 2/2003 Weaver, Jr. et al. ......... 370/206

FOREIGN PATENT DOCUMENTS

EP 0743768 12/1995
JP 1065647 3/1998

OTHER PUBLICATIONS

PCT International Search Report dated Jul. 18, 2000.
T. Uta, et al., "An Amplitude Limiting Scheme of CDMA Signals" Proceedings of Communication Society Meeting, p. 294, 1997; with English translation.

* cited by examiner

Primary Examiner—Nay Maung
Assistant Examiner—Alan T. Gantt
(74) Attorney, Agent, or Firm—Stevens, Davis, Miller & Mosher, LLP

(57) ABSTRACT

An envelope calculation section (113) calculates the amplitude of a transmission signal after the multiplexing thereof. When the calculated amplitude is beyond a permissible amplitude value, a correction coefficient calculation section (114) calculates a correction coefficient that is the difference between amplitude values before and after a correction. Multiplication sections (115) and (116) calculate a correction value by multiplying a filter coefficient by a correction coefficient. Subtraction sections (119) and (120) subtract the correction value from the transmission signal after a filtering operation. Thereby, the transmission amplitude at the time of a peak can be suppressed without increasing the number of filter operation circuits.

4 Claims, 4 Drawing Sheets

BASE STATION APPARATUS AND METHOD FOR SUPPRESSING PEAK ELECTRIC POWER

TECHNICAL FIELD

The present invention relates to a base station apparatus and a method for suppressing a peak power for a cellular system of an automobile telephone, a portable telephone and the like.

BACKGROUND ART

A cellular system for an automobile telephone, a portable telephone and the like, the demand of which is rapidly increasing in recent years, is a system where a base station is located at the center of each cell and the base station and one or more communication terminals in the cell simultaneously perform radio communication in multiple access.

A code division multiple access (CDMA) system, one of the multiple access systems, is a system where a signal spread in a wide band that is obtained by multiplying modulated information data by a spreading code is transmitted from the transmission side and the information data is demodulated on the reception side by performing the despreading of a received signal by multiplying it by the same spreading code as that on the transmission side at the same timing as that on the transmission side. Because each user can utilize the same frequency band in the CDMA system, the increase of channel capacity can be schemed. Consequently, the CDMA system is widely noticed for a cellular system.

However, each user utilizes the same frequency band at the same time in the CDMA system, a base station should transmit a plurality of signals by multiplexing them. Consequently, the CDMA system has a problem that a transmission amplitude at a peak time becomes very high in comparison with an average amplitude. For preventing the distortion of a transmission signal even at the time of a peak, an amplifier having a large linear operating range should be used. Then, a high voltage power source is needed, which makes the apparatus larger.

Accordingly, for overcoming the problem, methods for suppressing the transmission amplitude at a peak time have conventionally been examined. There is a conventional base station disclosed in Japanese laid-open patent publication Hei 10-126309 as a base station that can suppress the transmission amplitude at a peak time.

FIG. 1 is a block diagram showing the structure of a conventional base station. Incidentally, in the following description, a case where QPSK modulation is used in primary modulation will be described as an example. Furthermore, it is supposed that a base station is performing radio communication with three users A–C.

In FIG. 1, a modulation section 1 performs the QPSK modulation of a transmission signal A to be transmitted to a user A, and outputs an in-phase component and an orthogonal component of the signal after the modulation to a spreading section 4. Similarly, a modulation section 2 performs the QPSK modulation of a transmission signal B to be transmitted to a user B, and outputs an in-phase component and an orthogonal component of the signal after the modulation to a spreading section 5. A modulation section 3 performs the QPSK modulation of a transmission signal C to be transmitted to a user C, and outputs an in-phase component and an orthogonal component of the signal after the modulation to a spreading section 6.

The spreading section 4 performs spread processing in which a peculiar spreading code is multiplied to the transmission signal A modulated in the QPSK modulation, and outputs the spread signal to a multiplexing section 7. Similarly, the spreading section 5 performs spread processing in which a peculiar spreading code is multiplied to the transmission signal B modulated in the QPSK modulation, and outputs the spread signal to the multiplexing section 7. The spreading section 6 performs spread processing in which a peculiar spreading code is multiplied to the transmission signal C modulated in the QPSK modulation, and outputs the spread signal which has been performed by the filter 10, and when the measured value is larger than a previously set permissible amplitude value, the amplitude controlling section 13 controls the attenuation amount of the in-phase component of a transmission signal at an attenuation section 17. Similarly, the amplitude controlling section 14 measures the amplitude value of a signal, the band restriction of which has been performed by the filter 11, and when the measured value is larger than a previously set permissible amplitude value, the amplitude controlling section 14 controls the attenuation amount of the orthogonal component of a transmission signal at an attenuation section 18.

A delay section 15 delays a signal of an in-phase component outputted from the multiplexing section 7 for a time equal to a necessary time for a series of attenuation amount operating processing performed in the interpolation section 8, the filter 10 and the amplitude controlling section 13, and the delay section 15 outputs the delayed signal to the attenuation section 17. Similarly, a delay section 16 delays a signal of an orthogonal component outputted from the multiplexing section 7 for a time equal to a necessary time for a series of attenuation amount operating processing performed in the interpolation section 9, the filter 11 and the amplitude controlling section 14, and the delay section 16 outputs the delayed signal to the attenuation section to the multiplexing section 7.

The multiplexing section 7 divides spread signals outputted from the spreading sections 4–6 into in-phase components and orthogonal components to add them respectively. The multiplexing section 7 then outputs an in-phase component signal to an interpolation section 8 and a delay section 15, and outputs an orthogonal component signal to an interpolation section 9 and a delay section 14.

The interpolation sections 8 and 9 increase their sampling rates by M (M is a natural number) times, and perform zero-insertion interpolation where zero is inserted at a sampling point where no signal exists, respectively.

A filter 10 performs the band restriction of an interpolated signal outputted from the interpolation section 8 by means of a filter coefficient set in a filter coefficient memory 12 previously, and outputs the signal after the band restriction to an amplitude controlling section 13. Similarly, a filter 11 performs the band restriction of an interpolated signal outputted from the interpolation section 9 by means of a filter coefficient set in the filter coefficient memory 12 previously, and outputs the signal after the band restriction to an amplitude controlling section 14.

The amplitude controlling section 13 measures the amplitude value of a signal, the band restriction of 18.

The attenuation section 17 attenuates the amplitude of the in-phase component of a transmission signal under the control of the amplitude controlling section 13. Similarly, the attenuation section 18 attenuates the amplitude of the orthogonal component of a transmission signal under the control of the amplitude controlling section 14.

Interpolation sections 19 and 20 increase their sampling rates by M (M is a natural number) times, and perform zero-insertion interpolation where zero is inserted at a sampling point where no signal exists, respectively.

A filter 21 performs the band restriction of an interpolated signal outputted from the interpolation section 19 by means of a filter coefficient set in the filter coefficient memory 12 previously, and outputs the signal after the band restriction to a D/A conversion section 23. Similarly, a filter 22 performs the band restriction of an interpolated signal outputted from the interpolation section 20 by means of a filter coefficient set in the filter coefficient memory 12 previously, and outputs the signal after the band restriction to a D/A conversion section 24.

The D/A conversion section 23 converts a transmission signal of a digital in-phase component outputted from the filter 21 to an analog signal. Similarly, the D/A conversion section 24 converts a transmission signal of a digital orthogonal component outputted from the filter 22 to an analog signal.

As described above, the conventional base station measures an amplitude value of a signal the band of which is restricted by means of filter operations, and when the measured value is larger than a permissible amplitude value set previously, the transmission amplitude at the time of a peak is suppressed by controlling the attenuation amount of a transmission signal.

However, the filter operation needs a long tap length for preventing deterioration in its pass band and for obtaining very large suppressing characteristics in its rejection band. The aforesaid base station needs two filter operation circuits per component. For example, in case of the QPSK modulation, four filter operation circuits are needed.

That is, the aforesaid conventional base station should increase its filter operation circuit for suppressing a transmission amplitude at the time of a peak. Consequently, the conventional base station has a problem that the scale of its circuit increases and its consumption electric power also increases.

DISCLOSURE OF INVENTION

The object of the present invention is to provide a base station apparatus/capable of suppressing a transmission amplitude at the time of a peak without increasing the number of its filter operation circuits and a method for suppressing its peak power.

The object can be attained by calculating a correction coefficient when the amplitude of a transmission signal is beyond a permissible amplitude value, and by subtracting a correction value obtained by multiplying a correction coefficient by a filter coefficient from a transmission signal after filtering operation.

BEST MODE FOR CARRYING OUT THE INVENTION

Hereafter, embodiments of the present invention will be described in detail with reference to the attached drawings. Incidentally, in the following description a case where QPSK modulation is used in primary modulation will be described as an example. Furthermore, it is supposed that a base station is performing radio communication with three users A–C.

EMBODIMENT 1

Figure 1:
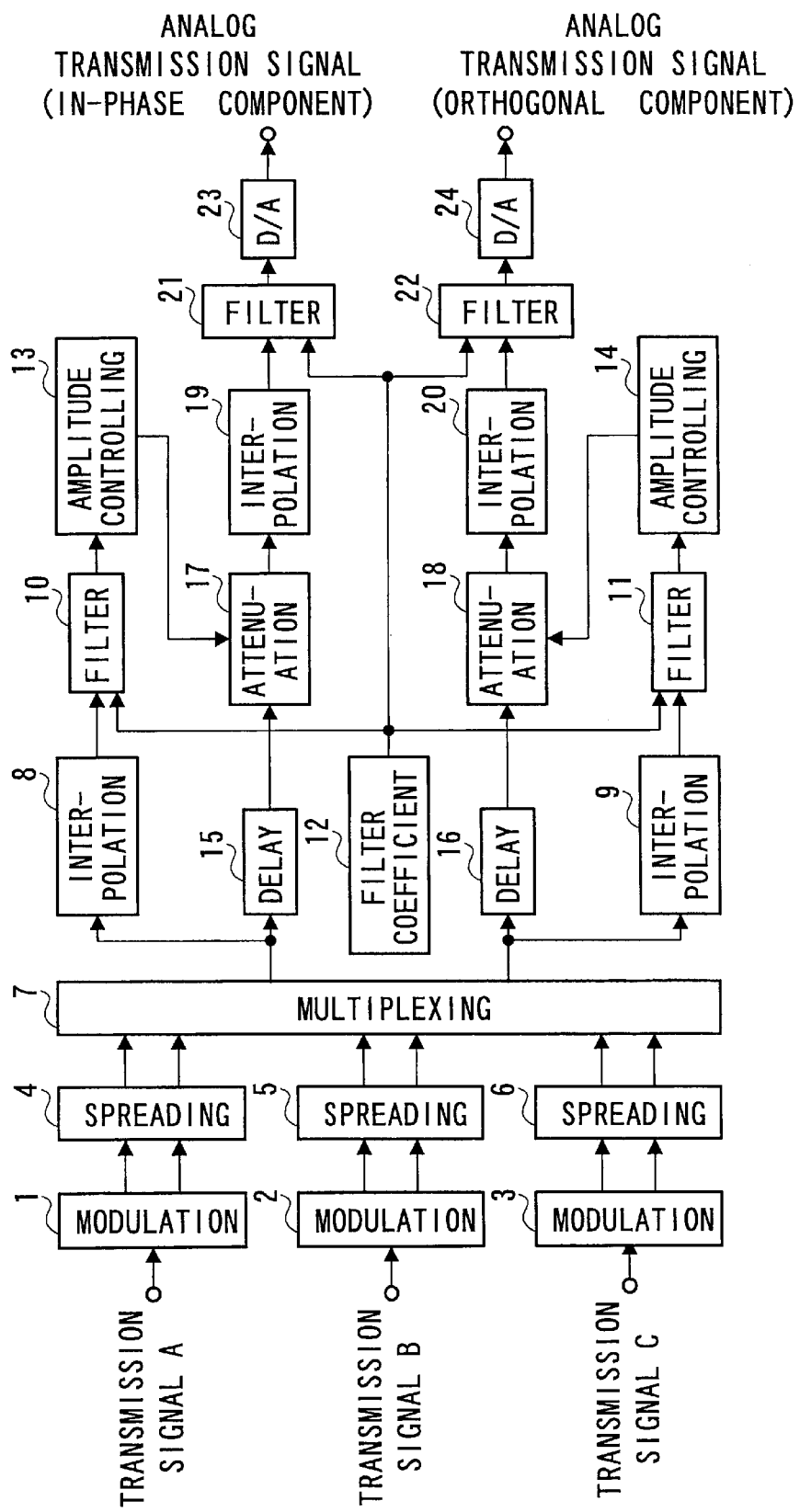
FIG. 1 is a block diagram showing the structure of a conventional base station.
Figure 2:
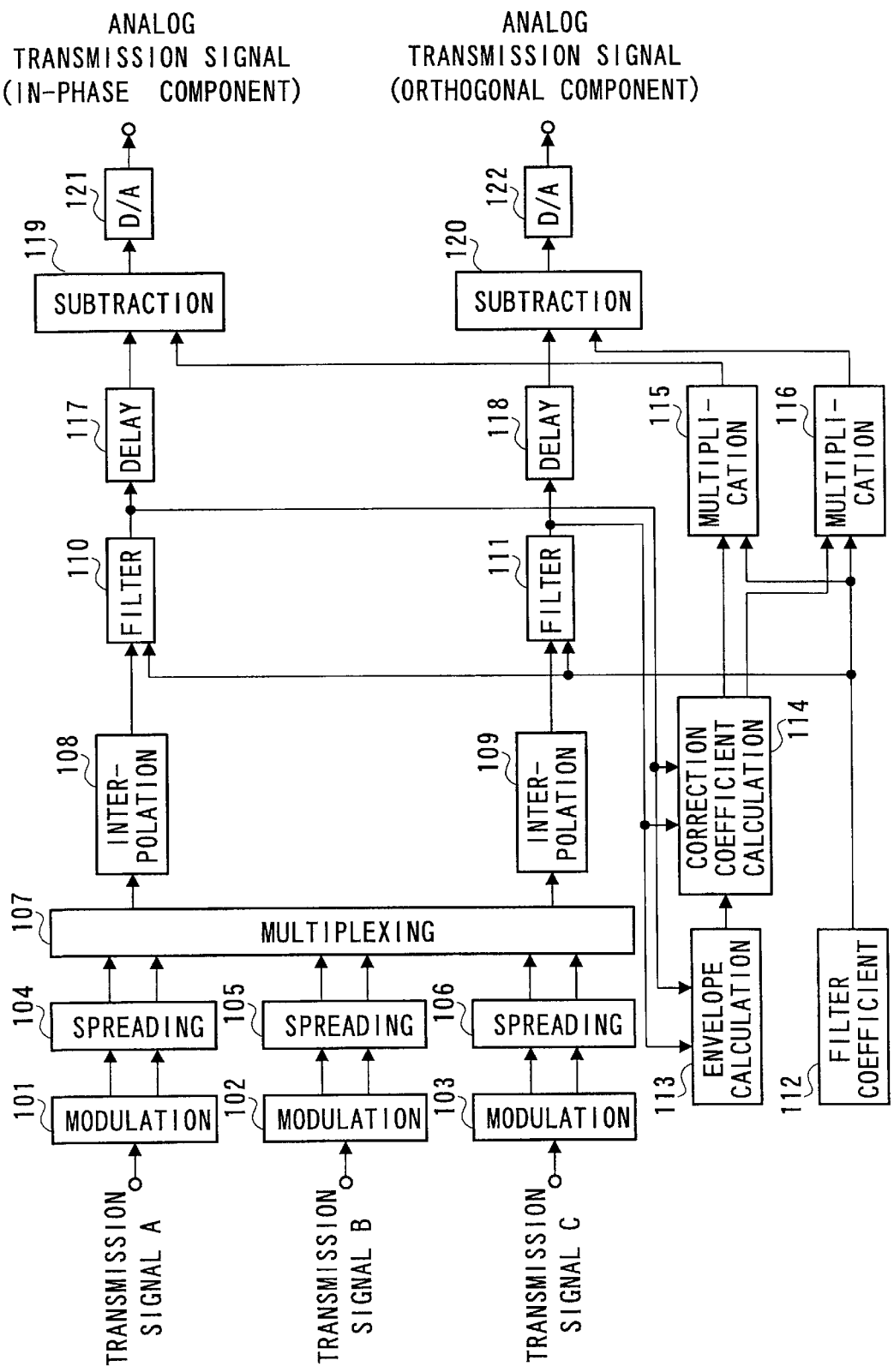
FIG. 2 is a block diagram showing the structure of a base station according to a first embodiment of the present invention.

FIG. 2 is a block diagram showing the structure of a base station according to the embodiment 1 of the present invention.

In FIG. 2, a modulation section 101 performs the QPSK modulation of a transmission signal A to be transmitted to a user A, and outputs an in-phase component and an orthogonal component of the signal after the modulation to a spreading section 104. Similarly, a modulation section 102 performs the QPSK modulation of a transmission signal B to be transmitted to a user B, and outputs an in-phase component and an orthogonal component of the signal after the modulation to a spreading section 105. A modulation section 103 performs the QPSK modulation of a transmission signal C to be transmitted to a user C, and outputs an in-phase component and an orthogonal component of the signal after the modulation to a spreading section 106.

The spreading section 104 performs spread processing in which a peculiar spreading code is multiplied to the transmission signal A modulated in the QPSK modulation, and outputs the spread signal to a multiplexing section 107. Similarly, the spreading section 105 performs spread processing in which a peculiar spreading code is multiplied to the transmission signal B modulated in the QPSK modulation, and outputs the spread signal to a multiplexing section 107. The spreading section 106 performs spread processing in which a peculiar spreading code is multiplied to the transmission signal C modulated in the QPSK modulation, and outputs the spread signal to a multiplexing section 107.

The multiplexing section 107 divides spread signals outputted from the spreading sections 104–106 into in-phase components and orthogonal components to add them respectively. The multiplexing section 107 then outputs an in-phase component signal to an interpolation section 108, and outputs an orthogonal component signal to an interpolation section 109.

The interpolation sections 108 and 109 increase their sampling rates by M (M is a natural number) times, and perform zero-insertion interpolation where zero is inserted at a sampling point where no signal exists, respectively. For example, in case of increasing the sampling rates by four times, the interpolation sections 108 and 109 insert three zeros among original sampling points.

A filter 110 performs the band restriction of an interpolated signal outputted from the interpolation section 108 by means of a filter coefficient set in a filter coefficient memory 112 previously, and outputs the signal after the band restriction to an envelope calculation section 113, a correction coefficient calculation section 114 and a delay section 117. Similarly, a filter 111 performs the band restriction of an interpolated signal outputted from the interpolation section 109 by means of a filter coefficient set in the filter coefficient memory 112 previously, and outputs the signal after the band restriction to the envelope calculation section 113, the correction coefficient calculation section 114 and a delay section 118.

The envelope calculation section 113 calculates an amplitude of a transmission signal that is a square root of the sum of the square of an in-phase component outputted from the filter 110 and the square of an orthogonal component outputted from the filter 111, and outputs the calculated amplitude to the correction coefficient calculation section 114. Incidentally, the locus of the calculated amplitude of the transmission signal is the envelope.

The correction coefficient calculation section 114 performs the comparison of largeness between the amplitude of a transmission signal calculated by the envelope calculation section 113 and the permissible amplitude value set previously, and when the amplitude of the transmission signal is beyond the permissible amplitude value, the correction coefficient calculation section 114 calculates a correction coefficient, which will be described later, to output the calculated correction coefficient to multiplication sections 115 and 116. Moreover, the correction coefficient calculation section 114 outputs zero as the correction coefficient to the multiplication sections 115 and 116 when the amplitude of a transmission signal is within the permissible amplitude value.

The multiplication section 115 multiplies a correction coefficient outputted from the correction coefficient calculation section 114 by the filter coefficient set in the filter coefficient memory 112. Thereby, the multiplication section 115 calculates a correction value of an in-phase component, which will be described later, to output the calculated correction value to a subtraction section 119. Similarly, the multiplication section 116 multiplies a correction coefficient outputted from the correction coefficient calculation section 114 by the filter coefficient set in the filter coefficient memory 112. Thereby, the multiplication section 116 calculates a correction value of an orthogonal component, which will be described later, to output the calculated correction value to a subtraction section 120.

A delay section 117 delays a signal after the band restriction, which is outputted from the filter 110, for a time equal to a time necessary for a series of correction processing performed in the envelope calculation section 113, the correction coefficient calculation section 114 and the multiplication section 115, and the delay section 117 outputs the delayed signal to the subtraction section 119. Similarly, a delay section 118 delays a signal after the band restriction, which is outputted from the filter 111, for a time equal to a time necessary for a series of correction processing performed in the envelope calculation section 113, the correction coefficient calculation section 114 and the multiplication section 116, and the delay section 118 outputs the delayed signal to the subtraction section 120.

The subtraction section 119 decreases the amplitude of a transmission signal by subtracting a correction value calculated by the multiplication section 115 from an output signal of the delay section 117. Similarly, the subtraction section 120 decreases the amplitude of a transmission signal by subtracting a correction value calculated by the multiplication section 116 from an output signal of the delay section 118.

A D/A conversion section 121 converts a transmission signal of a digital in-phase component outputted from the subtraction section 119 to an analog signal. Similarly, a D/A conversion section 122 converts a transmission signal of a digital orthogonal component outputted from the subtraction section 120 to an analog signal.

Next, the correction coefficient calculation processing performed at the correction coefficient calculation section 114 will be described with reference to the signal point layout drawing of FIG. 3.

Figure 3:
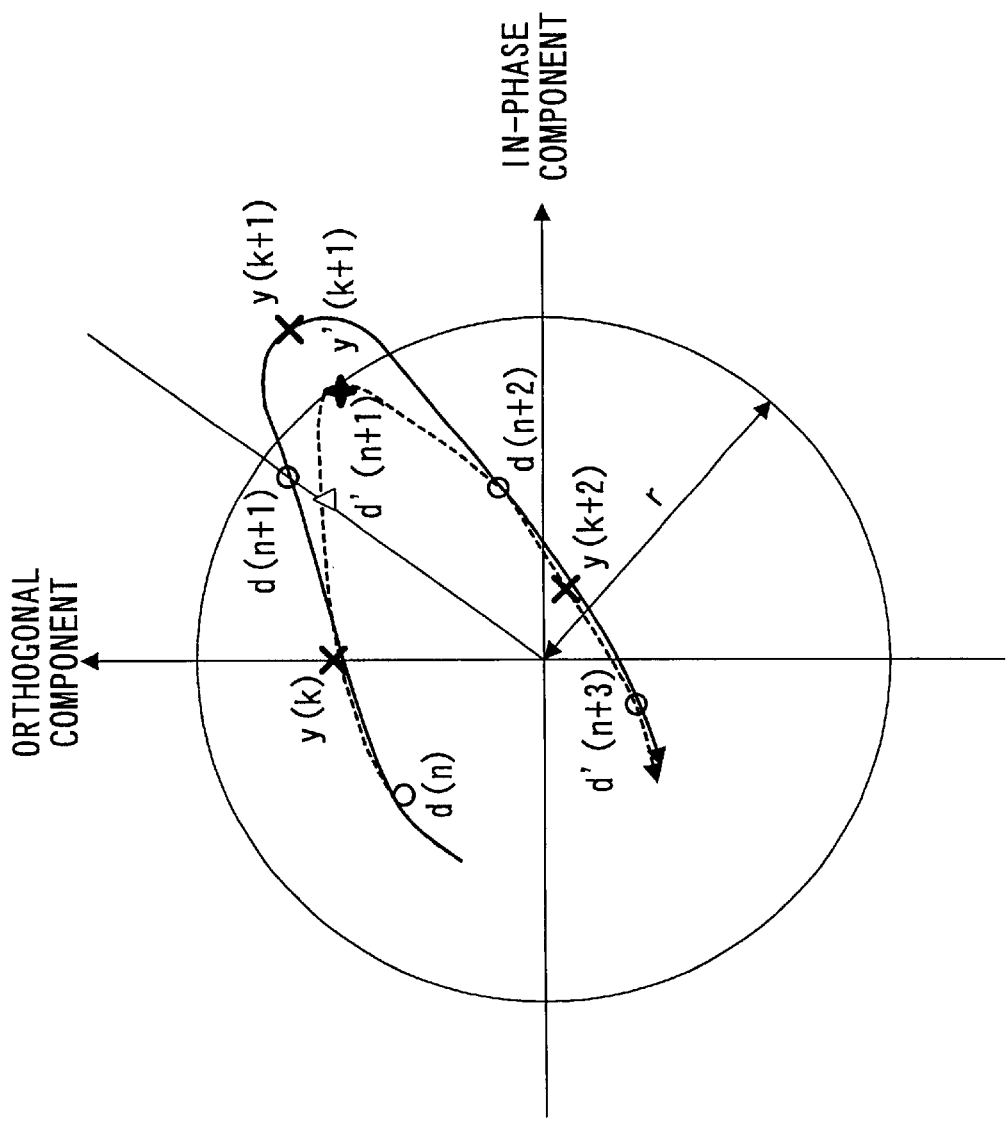
FIG. 3 is a signal point layout drawing for illustrating a correction coefficient calculation processing of the base station according to the first embodiment of the present invention.

In FIG. 3, input signals are designated as d(n), d(n+1), ..., and signals to be inserted are designated as y(k), y(k+1), ... Because FIG. 3 shows a filter of twofold over sampling as an example, a signal inserted between each input signal is one. Then, the input signal "do" joined with the inserted signal "y" become filter outputs, and the locus, shown as a full line, connecting the filter outputs corresponds to an envelope before correction.

In FIG. 3, the envelope is beyond a permissible amplitude value indicated by the radius "r" at an inserted signal y(k+1) between input signals d(n+1) and d(n+2). Accordingly, the base station corrects the input signal "d" so that the inserted signal y(k+1) becomes an inserted signal y(k+1).

The correction coefficient calculation section 114 first examines amplitude values of the input signals d(n +1) and d(n+2) before and after the time "k", and selects the input signal having a larger amplitude value as an object for correction. This is why an envelope of filter outputs can more effectively corrected in the case where the input signal having a larger amplitude value is corrected than in the case where the input signal having a smaller amplitude value is corrected. Accordingly, the correction coefficient calculation section 114 selects the input signal d(n+1) as a correction object.

And then, the correction coefficient calculation section 114 calculates a correction coefficient in conformity with the following processes for correcting the selected input signal d(n+1) to an input signal d'(n+1) so that the envelope is not beyond the permissible amplitude value.

Supposing that an in-phase component of the inserted signal y(k+1) is $y_i(k+1)$, and an orthogonal component of the inserted signal y(k+1) is $Y_q(k+1)$, the envelope $y_e(k+1)$ of the inserted signal y(k+1) becomes the following expression (1).

$$y_e(k+1) = \sqrt{y_i^2(k+1) + y_q^2(k+1)} \quad (1)$$

The correction coefficient calculation section 114 receives the envelope $y_e(k+1)$ from the envelope calculation section 113, the in-phase component $d_i(n+1)$ of the input signal d(n+1) from the filter 111, and the orthogonal component $d_q(n+1)$ of the input signal d(n+1) from the filter 111, respectively, and calculates the in-phase component $d_i'(n+1)$ of the input signal d'(n+1) in conformity with the following expression (2), and further calculates the orthogonal component $d_q'(n+1)$ of the input signal d'(n+1) in conformity with the following expression (3).

$$d_i'(n+1) = d_i(n+1) \times \frac{r}{y_e(k+1)} \quad (2)$$

$$d_q'(n+1) = d_q(n+1) \times \frac{r}{y_e(k+1)} \quad (3)$$

Because the correction coefficient is a difference between an input signal and a signal after the amplitude of the input signal is suppressed, the correction coefficient calculation section 114 calculates the correction coefficient $\delta_i(n+1)$ of the in-phase component of the input signal d'(n+1) in conformity with the following expression (4), and calculates the correction coefficient $\delta_q(n+1)$ of the orthogonal compo nent of the input signal d'(n+1) in conformity with the following expression (5).

$$\delta_i(n+1) = d_i(n+1) \times \frac{1-r}{y_e(k+1)} \quad (4)$$

$$\delta_q(n+1) = d_q(n+1) \times \frac{1-r}{y_e(k+1)} \quad (5)$$

The correction coefficient calculation section 114 outputs the correction coefficient $\delta_i(n+1)$ to the multiplication section 115, and outputs the correction coefficient $\delta_q(n+1)$ to the multiplication section 116. Incidentally, the envelope after the correction is shown in FIG. 3 as a broken line.

Next, the calculation processing of a correction value performed in the multiplication sections 115 and 116 will be described.

Supposing that the tap length of a filter is designated by "J", the multiplication section 115 calculates a correction value $\Delta_i(k+1)$ of an in-phase component by multiplying the correction coefficient $\delta_i(n+1)$ inputted from the correction coefficient calculation section 114 by each filter coefficient h(j) ("j" is an integer, and fills the relational expression $0 \leq j \leq J$) set in the filter coefficient memory 112 and by performing the summation operation of the products as shown in the following expression (6). Similarly, the multiplication section 116 calculates a correction value $\Delta_q(k+1)$ of an orthogonal component by multiplying the correction coefficient $\delta_q(n+1)$ inputted from the correction coefficient calculation section 114 by each filter coefficient h(j) set in the filter coefficient memory 112 and by performing the summation operation of the products as shown in the following expression (7).

$$\Delta_i(n+1) = \delta_i(n+1) \times \sum_{j=0}^{J} h(j) \quad (6)$$

$$\Delta_q(n+1) = \delta_q(n+1) \times \sum_{j=0}^{J} h(j) \quad (7)$$

The multiplication section 115 outputs the correction value $\Delta_i(k+1)$ to the subtraction section 119. Moreover, the multiplication section 116 outputs the correction value $\Delta_i(k+1)$ to the subtraction section 120.

And then, the inserted signal y(k+1) is corrected to the inserted signal y'(k+1) by subtracting the correction values from the filter outputs in the subtraction sections 119 and 120, respectively.

Next, the flow of a transmission signal in the base station having the aforesaid structure will be described.

Transmission signals to respective users are modulated in the modulation sections 101–103, respectively, and the spread processing to each modulated signal is performed in the spreading sections 104–106, respectively. After that, the spread signals are multiplexed in the multiplexing section 107.

Zeros are inserted into no signal portions of the in-phase component of the multiplexed transmission signal in the interpolation section 108. The frequency band of the in-phase component is then restricted on the basis of the filter coefficient in the filter 110. Similarly, zeros are inserted into no signal portions of the orthogonal component of the multiplexed transmission signal in the interpolation section 109. The frequency band of the in-phase component is then restricted on the basis of the filter coefficient in the filter 111.

And then, the envelope calculation section 113 calculates an envelope based on the outputs of the filters 110 and 111, and the correction coefficient calculation section 114 judges whether the correction of the transmission signal is needed or not on the basis of the relationship of the largeness of the calculated envelope and the permissible amplitude value.

In the case where the envelope is larger than the permissible amplitude value and the correction is judged to be needed, the correction coefficient calculation section 114 calculates a correction coefficient that is a difference between the inputted signal and the signal after its amplitude is suppressed, and the multiplication sections 115 and 116 calculate the correction value by multiplying the correction coefficient by the filter coefficients.

The in-phase component of the transmission signal the frequency band of which has been restricted by the filter 110 passes through the delay section 117 to be delayed. After that, a correction value outputted from the multiplication section 115 is subtracted from the delayed in-phase component to correct it in the subtraction section 119. Similarly, the orthogonal component of the transmission signal the frequency band of which has been restricted by the filter 111 passes through the delay section 118 to be delayed. After that, a correction value outputted from the multiplication section 116 is subtracted from the delayed orthogonal component to correct it in the subtraction section 120.

The in-phase component and the orthogonal component of the transmission signal after the correction are converted to analog signals by the D/A conversion section 120 and the D/A conversion section 121, respectively.

As described above, in the case where the amplitude of a transmission signal is beyond a permissible amplitude value, a correction coefficient is calculated, and a correction value obtained by multiplying the correction coefficient by a filter coefficient is subtracted from the transmission signal after a filtering operation. Consequently, a transmission amplitude at the time of a peak can be suppressed without the increase of the number of filter operation circuits.

EMBODIMENT 2

Figure 4:
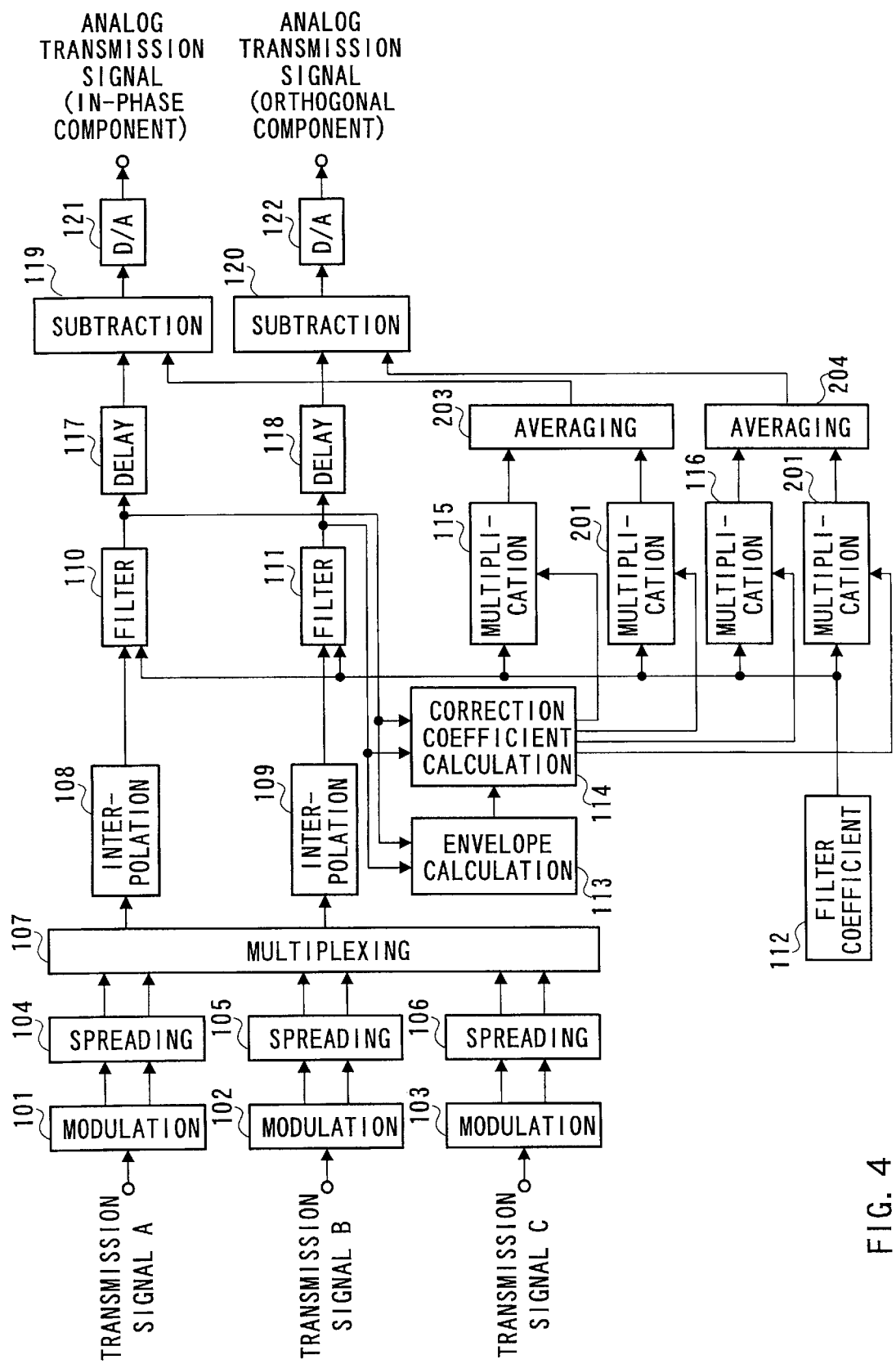
FIG. 4 is a block diagram showing the structure of a base station according to a second embodiment of the present invention.

FIG. 4 is a block diagram showing the structure of a base station according to the embodiment 2 of the present invention. Incidentally, the components in FIG. 4 similar to those in FIG. 2 are designated by the same reference numerals as those in FIG. 2, and their descriptions are omitted. The base station shown in FIG. 4 has a structure including multiplication sections 201 and 202 and averaging sections 203 and 204 in addition to the components of the base station shown in FIG. 2.

When the amplitude of a transmission signal calculated by the envelope calculation section 113 is beyond a permissible amplitude value, the correction coefficient calculation section 114 calculates the difference between the amplitudes of the transmission signal before and after the time, and performs the comparison of the largeness between the absolute value of the difference and a threshold value set previously.

When the absolute value is not beyond the threshold value, the correction coefficient calculation section 114 calculates a correction coefficient to each transmission signal, and outputs the correction coefficient of an in-phase component to the multiplication sections 115 and 201, and further outputs the correction coefficient of an orthogonal component to the multiplication sections 116 and 202.

Incidentally, when the amplitude of a transmission signal is not beyond the permissible amplitude value or the absolute value of the difference is beyond the threshold value, the correction coefficient calculation section 114 outputs the correction coefficient to the multiplication sections 115 and 116 similarly in the embodiment 1.

The multiplication section 201 calculates a correction value of an in-phase component by multiplying the correction coefficient outputted from the correction coefficient calculation section 114 by the filter coefficient set in the filter coefficient memory 112. Similarly, the multiplication section 202 calculates a correction value of an orthogonal component by multiplying the correction coefficient outputted from the correction coefficient calculation section 114 by the filter coefficient set in the filter coefficient memory 112.

Then, the multiplication sections 115 and 201 output the calculated correction value of the in-phase component to the averaging section 203. Moreover, the multiplication sections 116 and 202 output the calculated correction value of the orthogonal component to the averaging section 204.

The averaging section 203 averages the correction values of the in-phase component inputted from the multiplication sections 115 and 201, respectively, to output it to the subtraction section 119. Similarly, the averaging section 204 averages the correction values of the orthogonal component inputted from the multiplication sections 116 and 202, respectively, to output it to the subtraction section 120.

As described above, when the difference between the amplitudes of transmission signals before and after a transmission signal beyond the permissible amplitude value is small, the embodiment 2 calculates a correction coefficient to each transmission signal, and suppresses the transmission amplitude at the time of a peak on the basis of the calculated correction coefficient. Consequently, the embodiment 2 can suppress the transmission amplitude at the time of a peak more precisely than the embodiment 1.

As apparent from the aforesaid description, according to the base station apparatus and the method for suppressing a peak power of the present invention, the transmission amplitude at the time of a peak can be suppressed without increasing the number of filter operation circuits. Consequently, signals can be transmitted without being distorted with an amplifier having a narrow linear operation range without increasing the scale of the circuit. Therefore, it can be schemed to minimize the apparatus and to decrease its consumption electric power.

This application is based on the Japanese Patent Application No.HEI 11–116054 filed on Apr. 23, 1999, entire content of which is expressly incorporated by reference herein.

What is claimed is:

1. A base station apparatus comprising:

an interpolator that performs interpolation by inserting a signal into a multiplex transmission signal at a sampling point where there is no signal point;

a filter that performs band restriction of the signal after the interpolation, using a filter coefficient in a memory;

an envelope calculator that calculates an envelope corresponding to a locus of the signal after the band restriction; and a corrector that, when the envelope exceeds a permissible value, (i) calculates a correction coefficient, which is a ratio between said permissible value and the envelope, (ii) multiplies said correction coefficient and filter coefficient and calculates a correction value, and (iii) corrects the signal after the band restriction by subtracting said correction value from said signal after the band restriction.

2. The base station apparatus according to claim 1, wherein the corrector, when correcting the signal inserted upon the interpolation, calculates the correction coefficient for one of signals before and after the interpolated signal that has a larger amplitude.

3. The base station apparatus according to claim 2, wherein the corrector, when a difference between the signals before and after the inserted signal is below a threshold value, calculates correction coefficients for both of said signals before and after the inserted signal respectively and averages the calculated coefficients.

4. A method for suppressing peak power, comprising the steps of:

performing interpolation by inserting a signal into a multiplex transmission signal at a sampling point where there is no signal point;

performing band restriction of the signal after the interpolation, using a filter coefficient in a memory;

calculating an envelope corresponding to a locus of the signal after the band restriction;

calculating a correction coefficient when the envelope exceeds a permissible value, said correction coefficient being a ratio between said permissible value and the envelope;

multiplying the correction coefficient and filter coefficient and calculating a correction value; and subtracting the correction value from the signal after the band restriction.

* * * * *